United States Patent
Ikeda et al.

(10) Patent No.: US 6,265,077 B1
(45) Date of Patent: Jul. 24, 2001

(54) CERAMIC ARTICLES AND METHOD FOR MANUFACTURING THE SAME

(75) Inventors: Mitsuji Ikeda, Nagoya; Masao Nishioka, Tokoname; Naotaka Katoh, Owariasahi, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/260,941

(22) Filed: Mar. 2, 1999

(30) Foreign Application Priority Data

Mar. 5, 1998 (JP) .................................................. 10-069255
Feb. 22, 1999 (JP) .................................................. 11-042749

(51) Int. Cl.$^7$ ....................................................... B32B 9/04
(52) U.S. Cl. .................. 428/446; 428/40.4; 428/41.1; 428/426; 428/428; 428/432; 428/450; 427/109; 427/249; 427/255.1; 427/255.2; 65/60.1; 65/60.8
(58) Field of Search ..................................... 428/428, 446, 428/450, 40.4, 41.1, 426, 432; 427/109, 255.1, 255.2, 249, 167; 65/60.1, 60.8

(56) References Cited

U.S. PATENT DOCUMENTS 5,723,172  3/1998  Sherman .

FOREIGN PATENT DOCUMENTS

| 44 41 132 A1 | 5/1996 | (DE) . |
| 0 361 542 | 4/1990 | (EP) . |
| 2 643 088 | 8/1990 | (FR) . |

Primary Examiner—Deborah Jones
Assistant Examiner—Abraham Bahta
(74) Attorney, Agent, or Firm—Burr & Brown

(57) ABSTRACT

A ceramic article having a base made of an insulating ceramic material, the insulating ceramic material includes a metal element, and a conductive surface layer provided on the base, wherein the conductive surface layer includes carbon atoms as its main component, and wherein the conductive surface layer further includes silicon atoms and atoms of the metal element present in the insulating ceramic material.

24 Claims, 3 Drawing Sheets

(1 of 3 Drawing Sheet(s) Filed in Color)

CERAMIC ARTICLES AND METHOD FOR MANUFACTURING THE SAME

BACKGROUND OF THE INVENTION

1. Field of the Invention

The present invention relates to a ceramic article with a surface modified layer and a method for producing the same.

2. Description of the Related Art

A jig made of an alumina sintered body is used for conveying a semiconductor material in a semiconductor-manufacturing facility. Such a jig made of an alumina sintered body, however, with a resistivity as high as 2000 to 3000 MΩ or more tends to charge when used, thus causing deposition of particles on the wafer mounting surface of the jig. To solve this problem, Japanese patent number 2,621,749 attempts to prevent the charge and deposition of particles on the wafer-mounting surface, by forming a silicon carbide film on the wafer-mounting-surface by means of chemical vapor deposition and regulating the thickness of the film to reduce the surface resistivity on the wafer-mounting-surface.

SUMMARY OF THE INVENTION

The inventors tried to produce a jig with a wafer-mounting surface according to the disclosure in this patent and finally discovered the following unexpected problems. Firstly, an alumina sintered body has a thermal expansion coefficient largely different from that of silicon carbide, thus resulting in cracks in the film and its peeling from the wafer-mounting surface. Moreover, a jig with a low surface resistivity is needed for preventing particle adsorption.

It is an object of the invention to provide a ceramic article with a base and a surface modified layer, which has a high electrical conductivity and which hardly peels from the base.

The present invention provides a ceramic article having a base made of an insulating ceramic material and a conductive surface modified layer provided on the base, and the surface modified layer comprising carbon atoms as its main component, silicon atoms and atoms of at least one metal element constituting the insulating ceramic material.

The invention also provides a method for manufacturing a ceramic article having a base made of an insulating ceramic material and a conductive surface modified layer provided on the base, the ceramic material comprising at least one metal element, the method comprising the steps of:

contacting a surface of the base with a gas containing a halogen to produce a corrosion product containing the metal element on the surface; and providing at least a carbon source gas and a silicon source gas onto the surface of the base to induce chemical vapor deposition so as to form a surface modified layer containing carbon atoms as its main component, silicon atoms and atoms of the metal element.

When forming a silicon carbide film on a base made of an alumina sintered body by means of chemical vapor deposition, the inventors tried to contact the surface of the base with a gas containing a halogen (referred to as "halogen series gas") to produce a corrosive product and then provide a carbon source gas and a silicon source gas with a carrier gas onto the corrosion product. Surprisingly, the inventors observed the formation of an unknown surface modified layer with impressively high conductivity on the surface.

BRIEF DESCRIPTION OF THE DRAWINGS

The file of this patent contains at least one color drawing or photograph. Copies of this patent with color drawing(s) or photograph(s) will be provided by the Patent and Trademark Office upon request and payment of necessary fee.

For a better understanding of the invention, reference is made to the attached drawings, wherein.

DETAILED EXPLANATION OF THE INVENTION

Figure 1:
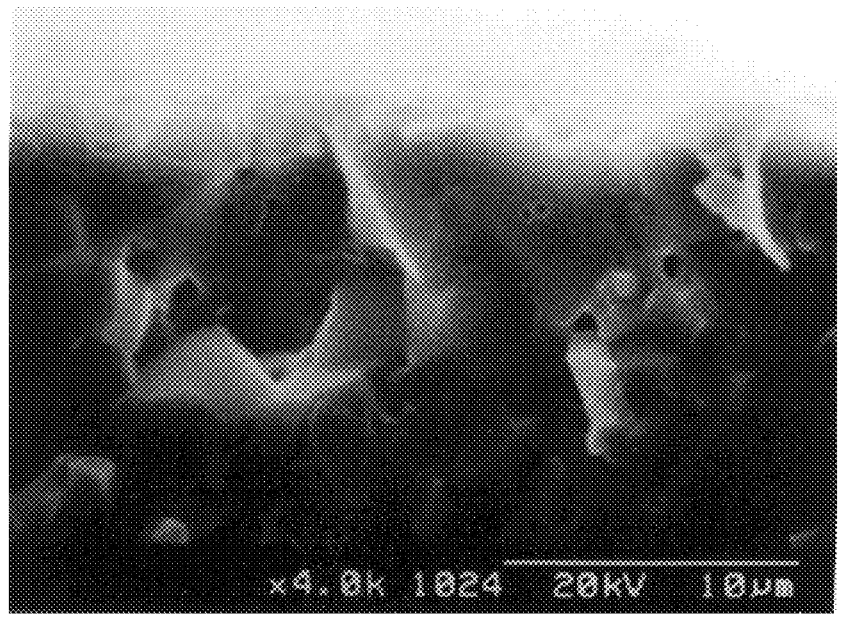
FIG. 1 is a photograph of a secondary electron image of a cross-section showing a surface modified layer and underlying base according to the invention.
Figure 2:
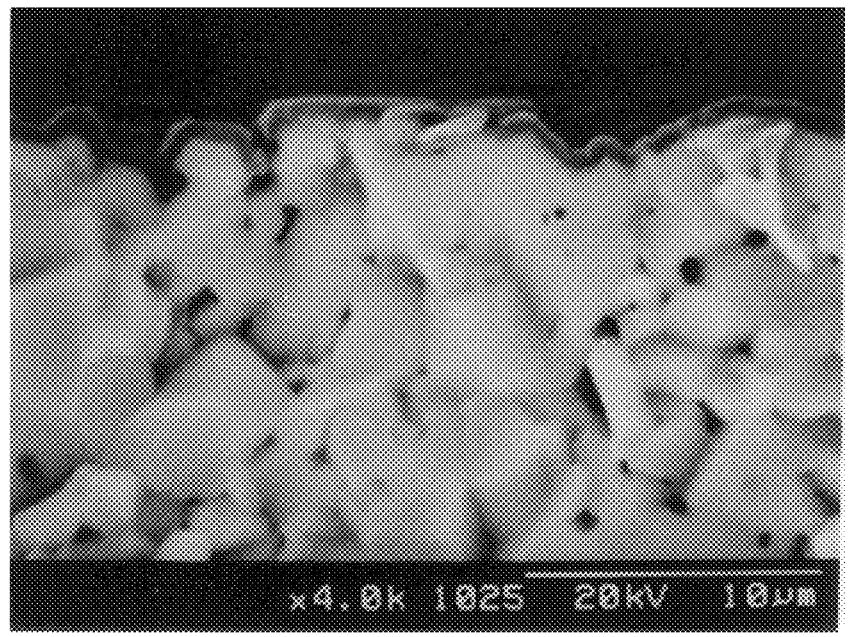
FIG. 2 is a photograph of a reflection electron image of a cross-section showing a surface modified layer and underlying base according to the invention.
Figure 3:
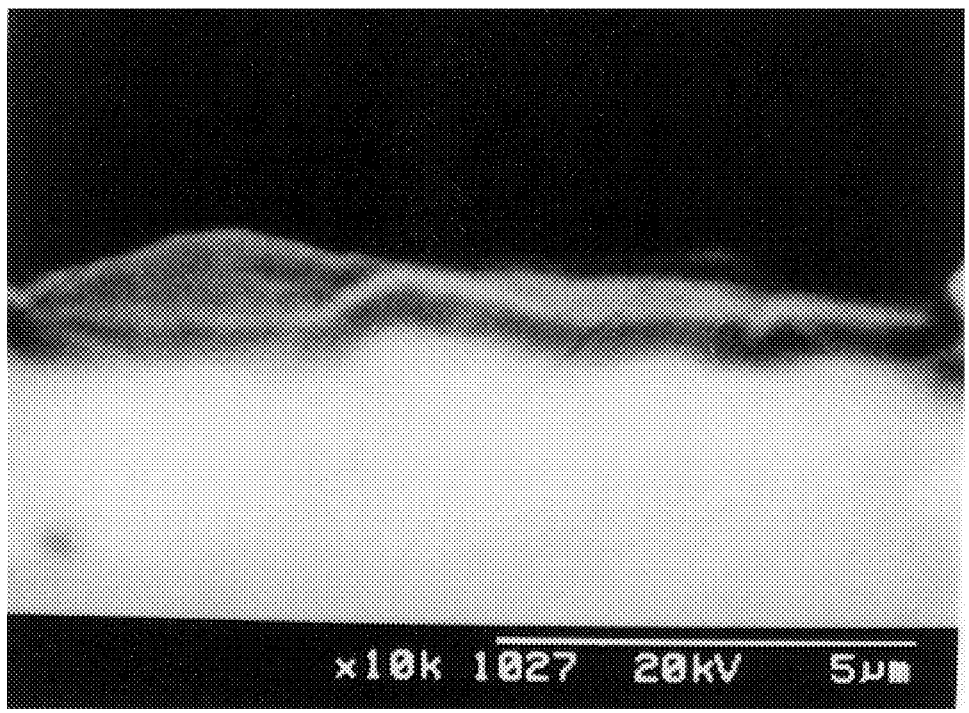
FIG. 3 is a photograph of an enlarged reflection electron image showing a part of the photograph shown in FIG. 2.

FIG. 1 is a photograph of a secondary electron image and FIG. 2 is a photograph of a reflection electron image, each showing a surface modified layer and underlying base according to the invention. FIG. 3 is a photograph of an enlarged reflection electron image showing a part of the photograph shown in FIG. 2. As can be seen from FIGS. 2 and 3, the whitish region corresponds to the alumina sintered body, and a film with a substantially uniform thickness is formed continuously on the surface of the sintered body. The film is colored blackish compared to the underlying whitish sintered body and therefore considered to contain carbon atoms having a molecular weight smaller than that of aluminum, as its main component.

Figure 4:
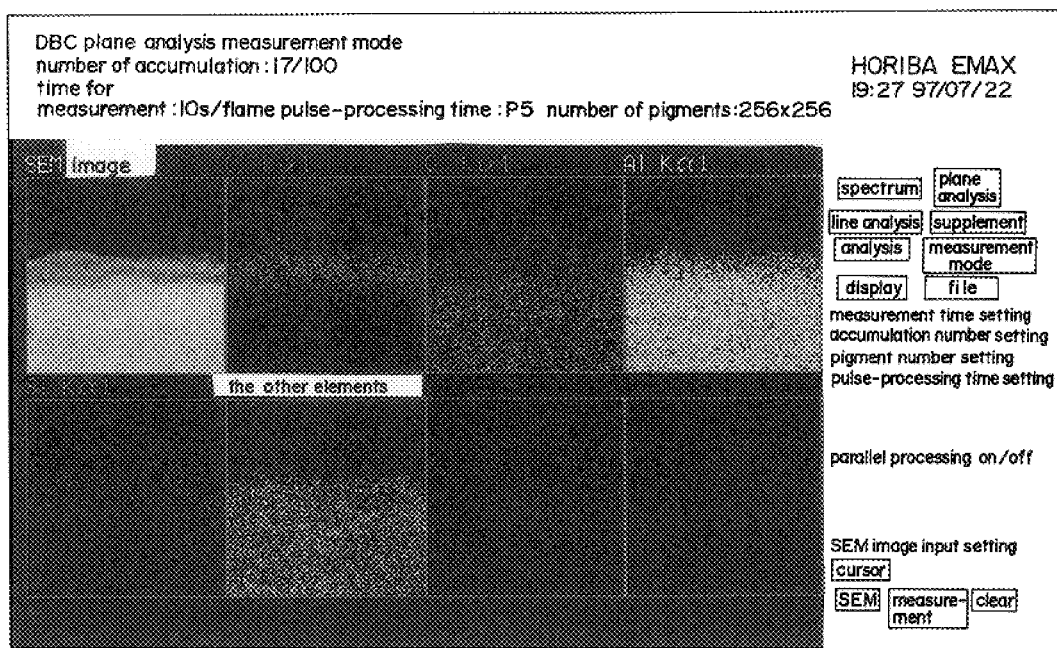
FIG. 4 is a photograph of a secondary electron image of a cross-section showing a surface modified layer and underlying base according to the invention and photographs showing elemental mappings, of C, O, Al, Si and the other atoms, by means of EDS.

The inventors further analyzed the surface modified layer by means of elemental mapping using EDS. FIG. 4 shows the results. The experimental conditions described in FIG. 4 in Japanese are as follows. The experiment was carried out using (HORIBA EMAX) on Jul. 22, 1997. The number of accumulation was 17, the time period for measurement was 10 second per flame, the time period for pulse-processing was P5 and number of pigments was 256×256. FIG. 4 includes 6 photographs, in which four are shown in the upper column and two are shown in the lower column. An SEM photograph is shown in left of the upper column and clearly shows a darkish film extending continuously on the alumina sintered body. The upper column also includes photographs showing elemental mappings of carbon (C), oxygen(O) and aluminum(Al). The lower column includes photographs showing elemental mappings of silicon(Si) and the other elements. Color dots shown in each photograph correspond to the following atom.

Red—carbon Green—oxygen

Yellow—aluminum Purple—silicon blue—the other elements

The surface modified layer has a high concentration of carbon atoms with substantially uniform distribution. Oxygen atoms mostly exist in the sintered body and are hardly seen in the layer. The sintered body has a high concentration of aluminum atoms which are balanced with the concentration of oxygen atoms. However, aluminum is clearly observed in the surface modified layer. The results confirm that aluminum atoms exist in the surface modified layer in a specific form other than alumina. Although silicon atoms also exist in the surface modified layer, that amount seems to be less than that of carbon atoms in the layer.

As can be seen from the above results, the surface modified layer has carbon atoms, which bond with aluminum and silicon atoms, as its main component.

The inventors discovered that the surface modified layer had an extremely high conductivity compared to that of a silicon nitride film, and scarcely showed cracks and peeling from an underlying base, for example made of alumina.

Although the mechanism for the formation of the inventive surface modified layer is not clear, the following possible explanation will be given. When a base, for example made of alumina, is attacked by a gas containing chlorine atoms at a high temperature, especially at a temperature allowing chemical vapor deposition to occur, atoms of a metal element, such as aluminum, existing in the surface region of the base react with chlorine atoms and are removed as vapor, making the surface of the base extremely rough. When a carbon source gas and silicon source gas are flown to the rough surface at a temperature allowing for a chemical vapor deposition reaction, aluminum chloride competes with the silicon source gas for the reaction with the carbon source gas to inhibit the deposition of pure silicon carbide and to incorporate silicon and aluminum atoms simultaneously into the resulting surface modified layer.

The inventive ceramic article has a surface resistivity of not higher than 10 Ω·cm and more preferably not higher than 0.1 Ω·cm. The surface resistivity is normally not lower than 50 Ω·cm.

The surface modified layer is preferably made of a reaction product of a carbon source gas, a silicon source gas and a corrosion product containing atoms of the metal element, which is produced by contacting an insulative ceramic material with a halogen series gas. In the embodiment, the corrosion product may preferably be a reaction product of the metal element and halogen.

The insulative ceramic material may preferably be aluminum nitride, sialon, zirconia, titania, spinnel, mulite, magnesia, silicon nitride and alumina, and most preferably alumina. The metal element may preferably be aluminum, and in this case, the insulative ceramic material may preferably be alumina, aluminum nitride or sialon.

The inventive ceramic article may be produced by subjecting a base to a corrosion process to produce a corrosion product on its surface and then providing at least a carbon source gas and silicon source gas onto the surface to perform chemical vapor deposition.

During the deposition, a halogen series gas may preferably be flown for producing a corrosion product on the surface of the base for 0.2 to 2.0 minutes and then a reducing gas, a silicon source gas and a carbon source gas may preferably be flown to form a surface modified layer, so that the corrosion of the surface of the base, most preferably alumina base, is progressed appropriately. By flowing a halogen series gas for not longer than 2.0 minutes, gas adsorption onto the growing surface modified layer inhibiting the growth of a CVD (Chemical Vapor Deposition) film, may be prevented. Such adsorption may occur by gases being produced by the decomposition of the halogen series gas, or by the reaction of the halogen series gas and the other gas or base.

A step for forming the surface modified layer by flowing a reducing gas, a silicon source gas and a carbon source gas may preferably be performed for not less than 1 minute, thereby the whole surface of the base may be covered with the surface modified layer to provide more uniform electrical resistivity thereof. By performing the above step for not longer than 15 minutes and regulating a time period for forming the layer, the thickness of the layer and ratio of metal element contained therein may be changed to regulate the electrical conductivity thereof. When the time period for performing the above step is too long, a normal silicon carbide layer with no metal elements is formed on the inventive surface modified layer containing the metal element, thereby causing cracks in the silicon carbide layer due to thermal stress and increasing the surface resistivity of the resulting ceramic article.

By performing the chemical vapor deposition reaction at a temperature not lower than 1200° C., the corrosion of the base surface and the formation of the surface modified layer may be enhanced. By performing the reaction at a temperature not higher than 1400° C., too much corrosion of the base surface and local inhibition of the formation of the layer may be avoided. Such local inhibition may occur, when the reactive carbon source gas and silicon source gas are reacted with each other vigorously in a gas phase distant from the base surface.

When flowing a silicon source gas, a carbon source gas and a carrier gas during the chemical vapor deposition reaction, the ratio between the flow rate of the carrier gas and the sum of the flow rates of the silicon source gas and carbon source gas may preferably be adjusted to 1:0.3 to 3.0. When the ratio is 1: lower than 0.3, the concentrations of the carbon source gas and silicon source gas is too low for smooth formation of the surface modified layer. When the ratio is 1: more than 3.0, the reaction of the carbon source gas and silicon source gas are too vigorous, often resulting in coarse particles of silicon carbide and thus increasing the surface roughness of the layer to provide fluctuated properties of the layer.

The carrier gas consists of an inert gas and a reducing gas, such as hydrogen gas.

The silicon source gas may preferably be selected from a group consisting of $SiCl_4$, $SiHCl_3$, $SiCl_2H_2$ and $SiH_4$.

The carbon source gas may preferably be selected from a group consisting of $CH_4$, $C_2H_6$ and $C_3H_8$.

The halogen series gas may preferably be selected from a group consisting of HCl, $Cl_2$, $SiCl_4$, $BCl_3$, $F_2$, $ClF_3$, $NF_3$, $SF_6$, $CF_4$, $CHF_3$, $C_2F_8$ and $C_2F_6$.

Experimental results will be shown below.

A base made of an alumina sintered body, with a purity of 99 percent and a relative density of 99 percent, was prepared.

A surface modified layer was formed by means of chemical vapor deposition. During the deposition, methane was used as a carbon source gas, $SiCl_4$ was used as a silicon source gas and hydrogen and argon were used as a carrier gases. Overall temperature schedules and flow rates of the gases are shown in table 1, in which each temperature and flow rates of the gases at each time point (measured as minutes) are indicated.

TABLE 1

| Time point (minute) | Temperature (° C.) | Argon (1/min) | Hydrogen (1/min) | Silicon tetrachloride (ccm) | Methane (1/min) | Pressure in furnace (torr) |
|---|---|---|---|---|---|---|
| 0 | 20 | 10 | 0 | 0 | 0 | 100 |
| 120 | T | 10 | 0 | 0 | 0 | 100 |
| 120 | T | 20 | 0 | 0 | 0 | 100 |
| 150 | T | 20 | 0 | 0 | 0 | 100 |

TABLE 1-continued

| Time point (minute) | Temperature (° C.) | Argon (1/min) | Hydrogen (1/min) | Silicon tetrachloride (ccm) | Methane (1/min) | Pressure in furnace (torr) |
|---|---|---|---|---|---|---|
| 150 | T | 5.2 | 11.9 | 10 | 0 | 100 |
| t1 | T | 5.2 | 11.9 | 40 | 0 | 100 |
| t1 | T | 5.2 | 11.9 | 40 | 7 | 100 |
| t2 | T | 5.2 | 11.9 | 40 | 7 | 100 |
| t2 | T | 5.2 | 11.9 | 0 | 0 | 100 |
| 221 | 800 | 5.2 | 11.9 | 0 | 0 | 100 |
| 221 | 800 | 0 | 0 | 0 | 0 | 100 |
| 321 | 800 | 0 | 0 | 0 | 0 | 100 |

(Experiment A)

In table 1, from a time point of 120 to 150 minutes, only argon was flown. From 150 to (t1) minutes, argon, hydrogen and silicon tetrachloride were flown to perform the corrosion process. From (t1) to (t2) minutes, methane was further flown to perform chemical vapor reaction. From (t2) to 221 minutes, argon and hydrogen were flown. In table 1, (t1) was variously changed between 150.0 and 152.0 minutes. That is, a time period from 150 minutes to (t1), for flowing silicon tetrachloride, hydrogen and argon without methane, was variously changed from 0.0 to 2.0 minutes. (t2) was fixed to 161.0 minutes. A temperature T for the deposition was fixed at 1300° C. The composition of each resulting surface modified layer was measured by means of EDS.

Consequently, when (t1) is 150.2 to 152.0 minutes, the resulting layer contained aluminum. However, when (t1) is 150.0 to 150.1 minutes, the resulting layer contained no aluminum.

Further, the resulting layers were analyzed by means of powdery X-ray diffraction method to confirm crystal lattice corresponding to that of 3C crystalline system of silicon carbide, SiC.

(Experiment B)

Surface modified layers were formed same as the experiment A, except that, in table 1, (t1) and (t2) were variously changed so that a time period (150 minutes to (t1)), for flowing silicon tetrachloride without methane, and a time period for the deposition ((t1) to (t2)) were variously changed as shown in table 2. A ratio, between a flow rate of a carrier gas and a sum of flow rates of silicon tetrachloride and methane gases, was adjusted to 1:1. The appearance and color tone of the surface, the surface resistivity and composition of the resulting layer were measured, as well as an amount of particles adsorbed onto the surface.

The resistivity was measured by means of four probe method at an ambient temperature as an electrical resistivity ($\Omega \cdot cm$). The layer surface was observed by eyes and an optical microscope (a magnification of 10 to 100 times) to observe the peeling of the layer from the base, cracks, surface roughness, particles and color tone. Particles with a diameter of not smaller than 0.5 micron per 1 square centimeter were counted.

TABLE 2

| Experimental number | Time period for flowing SiCl$_4$ without methane (minute) | Time period for deposition (minute) | Composition of layer | Appearance of layer surface | Color tone of layer surface | Surface resistivity of layer ($\Omega \cdot cm$) | Deposition of particles on layer surface | Content of Al diffused in SiC (weight %) |
|---|---|---|---|---|---|---|---|---|
| B1 | 0.2 | 1.0 | C, Si, Al | smooth and no peeling | uniform gray | 0.10–0.7 | 5–30 | 0.05 |
| B2 | 1.0 | 1.0 | C, Si, Al | smooth and no peeling | uniform gray | 0.04–0.10 | not higher than 5 | 0.2 |
| B3 | 2.0 | 1.0 | C, Si, Al | smooth and no peeling | uniform gray | 0.5–4.0 | 10–80 | 0.03 |
| B4 | 1.0 | 5.0 | C, Si, Al | smooth and no peeling | uniform gray | 0.03–0.08 | not higher than 5 | 0.3 |
| B5 | 1.0 | 10.0 | C, Si, Al | smooth and no peeling | uniform gray | 0.2–1.5 | 10–40 | 0.04 |
| B6 | 1.0 | 15.0 | C, Si, Al | smooth and no peeling | uniform gray | 3.0–10.0 | 50–120 | 0.01 |
| B7 | 0.0 | 1.0 | C, Si | peeling | gray, partly white | infinite, not measurable | not lower than 1000 | not detectable |
| B8 | 0.1 | 1.0 | C, Si | peeling | gray, spotted white | infinite, not measurable | not lower than 1000 | not detectable |

In each of experimental numbers B1 to B6 according to the invention, a surface modified layer was formed containing carbon atoms as its main component, silicon and aluminum atoms. The resistivity of the resulting layer may be variously regulated to not more than 10 $\Omega \cdot cm$ by adjusting its manufacturing condition. Further, the surface modified layer is basically smooth, exhibits no peeling and prevents the adsorption of particles thereon.

In comparative examples B7 and B8, the resulting layer contained no aluminum and peeling of the layer was observed with white portions appearing on its surface. Also in the experimental numbers B7 and B8, the layer had a high surface resistivity and particle adsorption was observed on the surface.

FIGS. 1 to 4 relate to one of the resulting surface modified layers when the time period for deposition was adjusted t0 5.0 minutes.

The inventors analyzed the surface modified layers according to the experimental numbers B1 to B6, respectively, by means of the powdery X-ray diffraction method to obtain a diffraction peak corresponding to that of the 3C crystalline system of silicon carbide. Further, the EDS analysis, described above and shown in FIG. 4, supports the assertion that aluminum atoms do not exist in the layer as alumina. It is therefore believed that the surface modified layer consist mainly of silicon carbide polycrystals of a 3C crystalline system, in which silicon atoms in the crystal are partly substituted with aluminum atoms. Carbon and silicon both have a valence number of 4 and aluminum has a valence number of 3. Thus it is also believed that aluminum atoms substituting for silicon atoms function as holes, thus giving a high electrical conductivity and low surface resistivity to the inventive surface modified layer.

For further reducing the surface resistivity of the surface modified layer, the content of aluminum in the silicon carbide polycrystal constituting the layer may preferably be not lower than 0.01 weight percent and more preferably be not lower than 0.05 weight percent. Although the content of aluminum has no particular upper limit, generally, the content may preferably be not higher than 0.3 weight percent, because it is actually difficult to produce the surface modified layer with an aluminum content of higher than 0.3 weight percent.

The invention has been explained referring to the preferred embodiments, however, the present invention is not limited to the illustrated embodiments which are given by way of examples only, and may be carried out in various modes without departing from the scope of the invention.

What is claimed is:

1. A ceramic article having a base made of an insulating ceramic material, said insulating ceramic material consisting essentially of a metal element, and a conductive surface layer provided on said base, wherein said conductive surface layer comprises carbon atoms as its main component, and wherein said conductive surface layer further comprises silicon atoms and atoms of said metal element present in said insulating ceramic material.

2. The ceramic article as claimed in claim 1 having a surface resistivity of not higher than 10 Ω·cm.

3. The ceramic article as claimed in claim 1, wherein the surface layer is composed of a reaction product of a carbon source gas, a silicon source gas and a corrosion product containing the metal element produced by contacting the insulating ceramic material and a gas containing a halogen.

4. The ceramic article as claimed in claim 1, wherein the insulating ceramic material is alumina and the metal element is aluminum.

5. The ceramic article as claimed in claim 1, wherein the metal element is aluminum, the surface modified layer is composed of silicon carbide polycrystal in which a part of silicon atoms are substituted with aluminum atoms.

6. The ceramic article as claimed in claim 5, wherein the surface layer contains aluminum in a content of not lower than 0.01 weight percent and not higher than 0.30 weight percent.

7. A method for manufacturing a ceramic article having a base made of an insulating ceramic material and a conductive surface modified layer provided on the base, the ceramic material comprising at least one metal element, the method comprising the steps of:

contacting a surface of the base with a gas containing a halogen to produce a corrosion product containing the metal element on the surface; and providing at least a carbon source gas and a silicon source gas onto the surface of the base to induce chemical vapor deposition so as to form a surface modified layer containing carbon atoms as its main component, silicon atoms and atoms of the metal element.

8. The method for manufacturing a ceramic article as claimed in claim 7, wherein the metal element is aluminum.

9. The method for manufacturing a ceramic article as claimed in claim 8, wherein the insulating ceramic material is alumina and the gas containing a halogen is a gas containing chlorine.

10. The method for manufacturing a ceramic article as claimed in claim 7, wherein the corrosion product is produced by flowing the gas containing a halogen for a time period of 0.2 to 2 minutes.

11. The method for manufacturing a ceramic article as claimed in claim 10, wherein the carbon source gas and the silicon source gas are flown for a time period of not shorter than 1 minute and bot longer than 15 minutes after the corrosion product is produced.

12. The ceramic article as recited in claim 1, wherein said insulating ceramic material is selected from the group consisting of aluminum nitride, sialon, zirconia, titania, spinel, mullite, magnesia, silicon nitride and alumina.

13. The ceramic article as recited in claim 1, wherein said metal element is aluminum.

14. The ceramic article as recited in claim 2, wherein said ceramic material is selected from the group consisting of aluminum nitride, sialon, zirconia, titania, spinel, mullite, magnesia, silicon nitride and alumina.

15. The ceramic article as claimed in claim 2, wherein said ceramic insulating material is selected from the group consisting of sialon and silicon nitride and said metal element is silicon.

16. The ceramic article as claimed in claim 2, wherein the surface layer is composed of a reaction product of a carbon source gas, a silicon source gas and a corrosion product containing the metal element produced by contacting the insulating ceramic material and a gas containing a halogen.

17. The ceramic article as claimed in claim 2, wherein the insulating ceramic material is alumina and the metal element is aluminum.

18. The ceramic article as claimed in claim 3, wherein the insulating ceramic material is alumina and the metal element is aluminum.

19. The ceramic article as recited in claim 2, wherein the metal element is aluminum, the surface layer is composed of silicon carbide polycrystal in which part of silicon atoms are substituted with aluminum atoms.

20. The ceramic article as recited in claim 3, wherein the metal element is aluminum, the surface layer is composed of silicon carbide polycrystal in which part of silicon atoms are substituted with aluminum atoms.

21. The ceramic article as recited in claim 4, wherein the metal element is aluminum, the surface layer is composed of silicon carbide polycrystal in which part of silicon atoms are substituted with aluminum atoms.

22. The ceramic article as claimed in claim 19, wherein the surface layer contains aluminum in a content of not lower than 0.01 weight percent and not higher than 0.30 weight percent.

23. The ceramic article as claimed in claim 20, wherein the surface layer contains aluminum in a content of not lower than 0.01 weight percent and not higher than 0.30 weight percent.

24. The ceramic article as claimed in claim 21, wherein the surface layer contains aluminum in a content of not lower than 0.01 weight percent and not higher than 0.30 weight percent.

* * * * *